United States Patent
Jeong et al.

(10) Patent No.: US 10,613,561 B1
(45) Date of Patent: Apr. 7, 2020

(54) DEVICE AND METHOD FOR CALIBRATING A VOLTAGE REGULATOR

(71) Applicant: NXP USA, Inc., Austin, TX (US)

(72) Inventors: Jae Woong Jeong, Austin, TX (US); LeRoy Winemberg, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/174,374

(22) Filed: Oct. 30, 2018

(51) Int. Cl.
G05F 1/10 (2006.01)
G05F 1/565 (2006.01)
H03K 17/22 (2006.01)
G05F 1/575 (2006.01)

(52) U.S. Cl.
CPC .............. G05F 1/565 (2013.01); G05F 1/575 (2013.01); H03K 17/223 (2013.01)

(58) Field of Classification Search
CPC ............ G05F 1/575; G05F 1/56; G05F 1/565; H02M 2001/0045; H02M 3/156
See application file for complete search history.

(56) References Cited

U.S. PATENT DOCUMENTS

| | | |
|---|---|---|
| 6,683,481 B1 | 1/2004 | Zhou et al. |
| 6,686,783 B1 | 2/2004 | Huang |
| 6,894,544 B2 | 5/2005 | Gubbins |
| 7,030,668 B1 | 4/2006 | Edwards |
| 7,420,397 B2 | 9/2008 | Forel et al. |
| 2011/0181259 A1* | 7/2011 | Shen ................. G05F 1/575 323/282 |
| 2013/0265060 A1* | 10/2013 | Orendi ................. G01R 31/40 324/537 |

OTHER PUBLICATIONS

STMicroelectronics, "AN1772, Application Note, How to Control Power-up/Reset and Monitor the Voltage in Microprocessor Systems using ST Reset Circuits," Nov. 2003, 8 pages.

* cited by examiner

Primary Examiner — Sibin Chen
(74) Attorney, Agent, or Firm — Mary Jo Bertani

(57) ABSTRACT

An integrated circuit includes a voltage monitor circuit having a first input coupled to a reference voltage and a second input, a successive approximation register (SAR) circuit having an input coupled to an output of the voltage monitor circuit, a low drop out (LDO) regulator having an input coupled to an output of the SAR circuit and an output coupled to the second input, a discharge circuit coupled to the LDO output, voltage sensing circuit having a first input coupled to the reference voltage during a trim mode and coupled to the LDO output during a monitor mode, having a second input coupled to the reference voltage, and an output which asserts a sense indicator that indicates when a voltage at the first input goes higher or lower than the reference voltage by a predetermined amount. Control circuitry is configured to, during trim mode, periodically discharge the LDO output voltage.

20 Claims, 2 Drawing Sheets

DEVICE AND METHOD FOR CALIBRATING A VOLTAGE REGULATOR

BACKGROUND

Field

This disclosure relates generally to integrated circuits, and more specifically, to an integrated circuit having a voltage regulator with calibration circuitry.

Related Art

Analog circuitry implemented with complementary metal-oxide-semiconductor (CMOS) technology with an IC generally suffers from performance degradation. Such analog circuitry includes voltage monitors which are commonly used within integrated circuits (ICs) to monitor voltages at critical points in the IC. Voltage monitors typically have an inherent input offset due to mismatch and process variation which reduces accuracy of the monitor. Therefore, during production testing, trimming of the voltage monitor is needed to remove this inherent input offset. Currently, trimming is performed using automatic test equipment (ATE). However, testing using ATE takes a long time, which increases costs. Furthermore, integrated circuits may have multiple voltage monitors which need to each be trimmed, which leads to an even longer test time. In using an ATE for trimming, an adjustable voltage source with high accuracy is needed, along with a voltage meter and a test program to control this instrumentation, further increasing cost. Also, once an integrated circuit, or system on a chip (SoC) is released to a customer, it cannot be trimmed.

Low dropout (LDO) regulators are one type of voltage monitor that is commonly used. LDOs are typically trimmed at just one load condition during production testing. However, output voltage of LDO regulators typically changes depending on load condition such as load current and the trimmed code obtained during production testing may not be the best code for all load conditions. Hence, once LDO regulator output voltage changes, the trim code will be more accurate if the LDO regulator is calibrated again.

BRIEF DESCRIPTION OF THE DRAWINGS

Embodiments of the present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In selected embodiments, a low dropout (LDO) voltage regulator with a trimming circuit is formed on-chip, within a single IC. The on-chip calibration system includes a comparator, successive approximation register (SAR) circuit, a resistor string, control circuit, a voltage sensing circuit, discharge path at the voltage regulator output, and single-pole double-throw switch (SPDT). The voltage sensing circuit monitors output of the voltage regulator. When load current changes, the output of the voltage regulator also changes. The voltage sensing circuit detects the voltage change and generates a reset pulse. The reset pulse from the voltage sensing circuit triggers the control circuit and SAR circuit at the same time. The control circuit enables the discharge path every cycle while the SAR circuit searches the best trim code to compensate the voltage changes. During calibration mode, a single pole double throw (SPDT) switch is connected to reference voltage so that voltage sensing circuit does not affect calibration. During monitor mode, the SPDT switch is connected to the output of the voltage regulator and the voltage sensing circuit monitors the output of the voltage regulator. The control circuit generates patterns for a discharge path as well as a control signal for the SPDT switch. The on-chip calibration circuit monitors output of the voltage regulator in real time and when a voltage change is detected, on-chip trim is performed automatically to compensate the voltage change. After that, the on-chip calibration system returns to monitor mode and monitors voltage again.

Figure 1:
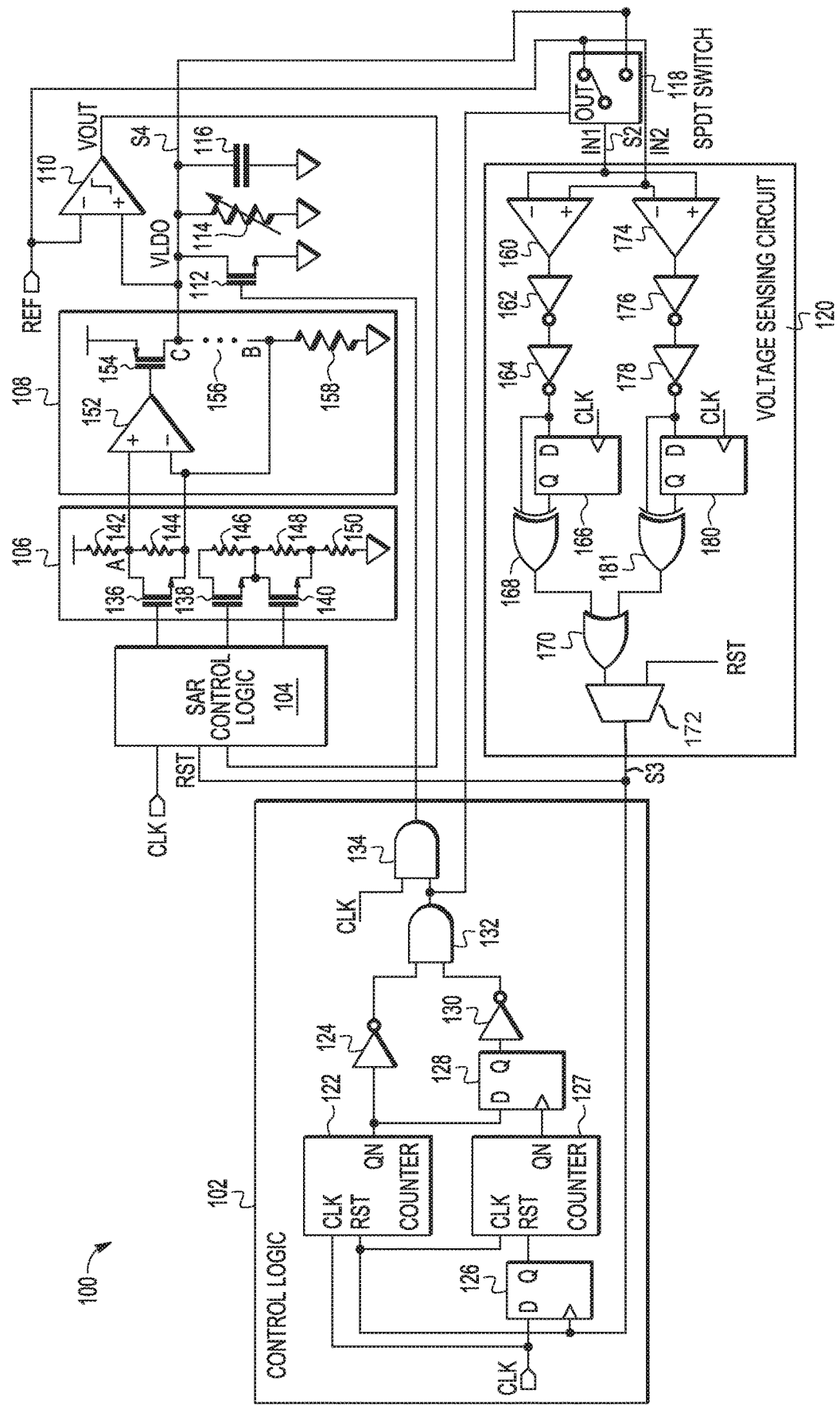
FIG. 1 illustrates, in partial block diagram and partial schematic form, an integrated circuit having a voltage monitor with a trimming circuit, in a trimming mode configuration, in accordance with one embodiment of the present invention.

FIG. 1 illustrates, in partial block diagram and partial schematic form, an integrated circuit 100 including control circuitry 102, successive approximation registers (SAR) control circuitry 104, resistor string circuit 106, LDO regulator circuit 108, voltage monitor circuit 110, discharge circuit 112, discharge resistive element 114, discharge capacitor 116, single-pole double-throw (SPDT) switch 118, and voltage sensing circuit 120. Control circuitry 102 includes counter circuits 122, 126, inverters 124, 130, AND gates 132, 134, and flip-flops 126, 128.

Counter circuit 122 includes a clock input coupled to receive a system clock signal, a reset input coupled to a reset signal output by voltage sensing circuit 120, and an output coupled to an input of inverter 124 and a data input of flip-flop 128. Inverter 124 further includes an output coupled to a first input of AND gate 132. An output of AND gate 132 is coupled to an input of AND gate 134. An output of AND gate 134 is coupled to a control gate of discharge circuit 112. Counter circuit 126 includes a data input coupled to receive the system clock signal, a reset input coupled to the reset signal output by voltage sensing circuit 120, and an output coupled to a reset input of counter circuit 126. A data input of flip-flop 128 is coupled to the output of counter circuit 122. Flip-flop 128 further includes a reset input coupled to the output of counter circuit 126 and an output coupled to an input of inverter 130. An output of inverter 130 is coupled to a second input of AND gate 132. Output of AND gate 134 is coupled to a control electrode of discharge circuit 112, which is shown as an N-channel transistor.

SAR control circuitry 104 includes a first input coupled to an output of voltage regulator circuit 108 and a second input coupled to the output of voltage sensing circuit 120. SAR control circuitry 104 also receives a clock signal (CLK), which can be generated from within the integrated circuit 100, such as by a phase lock loop (PLL) (not shown). SAR control circuitry 104 provides control signals to resistor string 106.

Resistor string (R-string) 106 is a variable resistance circuit which includes a string of resistors, 142, 144 . . . 146, 148, 150 coupled in series with resistor 142 having a first terminal coupled to a supply voltage and a second terminal coupled to a first terminal of resistor 144. A break with ellipses is shown between resistors 144 and 146 and switches 136 and 138 to indicate additional (or fewer) resistors and corresponding switches may be included in R-string 106. Resistor 150 is at the end of the series of resistors 142, 144 . . . 146, 148, 150 with a first terminal coupled a second terminal of resistor 148 and a second terminal coupled to ground. Resistors 144 . . . 146, 148 can be enabled (i.e. not shorted) or disabled (i.e. shorted) by enabling or disabling switches 136 . . . 138, 140 by a corresponding control value stored in one or more registers of SAR control circuitry 104 and coupled to control electrodes of switches 136 . . . 138, 140. Switches 136 . . . 138, 140 can be implemented with a transistor with the corresponding resistor connected between the current electrodes of each transistor. The number of enabled resistors determines a resistance of R-string 106, and the resistance of R-string 106 controls the output current provided to an input of comparator 152 in LDO regulator circuit 108.

In the embodiment shown, switches 136, 138, 140 are implemented with N-channel transistors. When the corresponding control value from SAR control circuitry 104 is a one, the corresponding resistor is shorted out from resistor string 106 by the corresponding switch, and when the corresponding control value is a zero, the corresponding resistor is not shorted out (i.e. enabled) in the resistor string by the corresponding switch such that its resistance is additive to the resistor string. In one embodiment, each resistor 142, 144 . . . 146, 148, 150 has an increasing value by a power of 2. For example, resistor 142 may be 1 ohm, resistor 144 may be 2 ohms, resistor 146 may be 4 ohms, up until resistor 150 which may have a resistance of $2^N$ ohms, where N is the number of resistors in R-string 106. The value of each of control signal is provided in turn by SAR control circuitry 104 to enable or disable (i.e. connect or disconnect) the corresponding resistor 144 . . . 146, 148 to vary the resistance of R-string 106. Each resistor 142, 144 . . . 146, 148, 150 can be implemented as multiple resistor elements. In alternate embodiments, other variable resistance circuitry can be used in place of R-string 106.

LDO regulator circuit 108 includes comparator 152, switch 154, and resistors 156, 158 coupled in series. A first input of comparator 152 is coupled to node A between the second terminal of resistor 142 and the first terminal of resistor 144. A second input of comparator 152 is coupled to node B between a second terminal of resistor 142 and a first terminal of resistor 144. An output of comparator 152 is coupled to a control electrode of switch 154, which is shown as a P-channel transistor. A first current electrode of switch 154 is coupled to a supply voltage and a second current electrode of switch 154 is coupled to a first terminal of resistor 156. The second terminal of resistor 156 is coupled to the first terminal of resistor 158, and a second terminal of resistor 158 is coupled to ground. An output of LDO regulator circuit 108 is provided at node C, which is located where the second current electrode of switch 154 is connected to the first terminal of resistor 156.

Discharge circuit 112 includes N-channel transistor with a first current electrode coupled to the output of LDO regulator circuit 108, a second current electrode coupled to ground, and a gate electrode coupled to the output of control circuitry 102. Variable resistance element 114 includes a first terminal coupled to the output of LDO regulator circuit 108 and a second terminal coupled to ground. Capacitor 116 includes a first terminal coupled to the output of voltage regulator circuit 108 and a second terminal coupled to ground. Signal S4 is the voltage at the first terminal of capacitor 116

SPDT switch 118 includes a first input terminal coupled to the reference voltage (REF) and a second input terminal coupled to signal S4. The position of SPDT switch 118 is movable between the first and second input terminals and is controlled by a signal (shown as signal S2) output by AND logic circuit 132 in control circuitry 102. An output of SPDT switch 118 is provided as input to voltage sensing circuit 120.

Voltage sensing circuit 120 includes a first branch for detecting high voltage output by voltage regulator circuit 108 relative to the reference voltage, and a second path for detecting low voltages output by voltage regulator circuit 108 relative to the reference voltage VREF. Both paths can generate a reset or trim mode pulse when a change in the LDO output voltage is detected. The first detection and pulse generating circuitry senses and indicates when LDO output voltage goes lower than the reference voltage by a first predetermined amount and includes comparator 160, inverters 162, 164, latch circuit 166 and NOR logic circuit 168. Comparator 160 includes a negating input coupled to the output of SPDT switch 118 and a non-negating input coupled to the reference voltage VREF. The output of comparator 160 is provided as input to inverter 162, and the output of inverter 162 is provided as input to inverter 164. The output of inverter 164 is provided as data input to latch circuit 166. A clock signal is also provided as an input to latch circuit 166, and the output of latch circuit 166 is coupled as an input to NOR logic circuit 168. A second input to NOR logic circuit 168 is coupled to the output of inverter 164. The output of NOR logic circuit 168 is provided as a first input to OR logic circuit 170.

The second detection and pulse generating circuitry of voltage sensing circuit 120 senses and indicates when LDO output voltage goes higher than the reference voltage by a first predetermined amount and includes comparator 174, inverters 176, 178, latch circuit 180 and NOR logic circuit 181. Comparator 174 includes a non-negating input coupled to the output of SPDT switch 118 and a negating input coupled to the reference voltage VREF. The output of comparator 174 is provided as input to inverter 176, and the output of inverter 176 is provided as input to inverter 178. The output of inverter 178 is provided as data input to latch circuit 180. A clock signal is also provided as an input to latch circuit 180, and the output of latch circuit 180 is coupled as an input to NOR logic circuit 181. A second input to NOR logic circuit 181 is coupled to the output of inverter 178. The output of NOR logic circuit 181 is provided as a second input to OR logic circuit 170.

The output of OR logic circuit 170 is coupled to a first input of multiplexer 172. A second input to multiplexer 172 is coupled to the global reset signal. A control input to multiplexer 172 is an initialization signal that is asserted during reset. The output of multiplexer 172 (shown as signal S3) is provided as a reset input to latch circuit 126 and counter circuits 122, 126 in control logic circuitry 102.

Voltage monitor circuit 110 is shown as a comparator that includes a negating input coupled to a reference voltage supply and a non-negating input coupled to the output of LDO regulator circuit 108. Output from voltage monitor circuit 110 is coupled to an input to SAR control circuitry 104.

SAR control circuitry 104 provides control signals to switches 136-140, in turn, until N values are provided (in which these N values may be stored in a register of SAR control circuitry 104). For example, if N is 10, SAR control circuitry 104 provides 10 control values for switches 136 . . . 140, each switch 136 . . . 140 corresponding to one of resistors 144 . . . 148. Therefore, a successive approximation value (also referred to as a successive control value) is provided each cycle of the CLK signal. Upon entering the trimming mode, the reset signal (RST) is asserted to reset the value of SAR control circuitry 104 such that each control signal is zero and all switches 136 . . . 140 are set so that resistors 144 . . . 148 are enabled. During trimming mode, the output of voltage monitor circuit 110 (Vout), which is based on the difference between LDO output voltage (VLDO) at node C and a reference voltage, is provided to SAR control circuitry 104. With each clock cycle of the CLK signal, SAR control circuitry 104 determines the value of the next successive approximation value of B1:BN (starting with B1, corresponding to the resistor 144 . . . 148 having the largest resistance value, to BN. For example, if the reference voltage is larger than the LDO output voltage, Vout is 0 and SAR control circuitry 104 provides a 0 for the next control value to short out the corresponding resistor, and if the reference voltage is larger than the LDO output voltage, Vout is 1 and SAR control circuitry 104 provides a 1 for the next approximation value to enable the corresponding resistor. In this manner, N successive approximation values are provided by SAR control circuitry 104 to set the resistance of the string of resistors 144 . . . 148, by enabling or disabling each of switches 136 . . . 140, respectively. Each iteration brings the first input to comparator 152 closer in value to the second input of comparator 152.

After the N iterations to obtain all values of B1 to BN, the LDO output voltage at node C is now approximately equal to the reference voltage (with possibly a very small and negligible difference between the reference voltage and the LDO output voltage). Note that the accuracy of the convergence of the reference voltage and the LDO output voltage depends on N, in which a greater number of control values and corresponding resistors leads to a greater accuracy. Therefore, greater values of N provide greater accuracy but at a cost of greater iterations and thus greater time.

Switch 118 is a single pole double throw switch having a first contact (labeled "IN1") and a second contact (labeled "IN2"), allowing for two different configurations. A first configuration is a trim mode in which switch 118 set to connect to the first contact of each switch, and the second configuration is a monitor mode in which switch 118 is set to connect to the second contact. FIG. 1 illustrates switch 118 in the trim mode connected to reference voltage so that voltage sensing circuit 120 does not affect calibration or the trim process. During monitor mode, SPDT switch 118 is connected to LDO output voltage so voltage sensing circuit 120 can monitor the LDO output voltage.

Voltage sensing circuit 120 monitors the LDO output voltage during the monitor mode. When the load current changes, voltage sensing circuit 120 detects the change in LDO output voltage and generates the reset pulse. The reset pulse triggers control circuitry 102 and SAR control circuitry 104 simultaneously to enter the trim mode. During the trim mode, when load resistance becomes large, LDO output voltage (VLDO) is not trimmed properly due to large RC time constant of resistive element 114 and capacitor 116. Accordingly, a discharge path to ground through a current electrode of transistor 112 is used to discharge the LDO output voltage quickly before the reference voltage is compared to the LDO output voltage by voltage monitor circuit 110. Control circuitry 102 generates a signal at the output of AND gate 132 that is coupled to the gate of transistor 112 to enable the discharge path every clock cycle while SAR control circuitry 104 searches for a trim code that compensates the voltage changes. Control circuitry 102 also generates a control signal at the output of AND gate 134 to place SPDT switch 118 in the trim configuration so that the reference voltage is provided to both the IN1 and IN2 voltages at the inputs to comparators 160, 174 in voltage sensing circuit 120, thereby causing the output of comparators 160, 174, inverters 164, 178, and latch circuits 166, 180 to be low while the output of NOR gates 168, 161, OR gate 170, and multiplexer 172 is high, causing the reset signal to be asserted.

Figure 2:
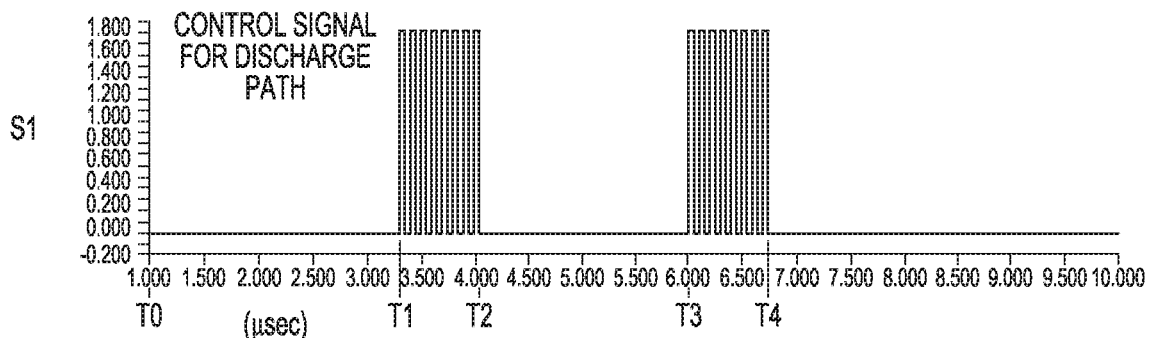
FIG. 2 illustrates an example of a time history diagram of a control signal for a discharge path of the integrated circuit of FIG. 1.
Figure 3:
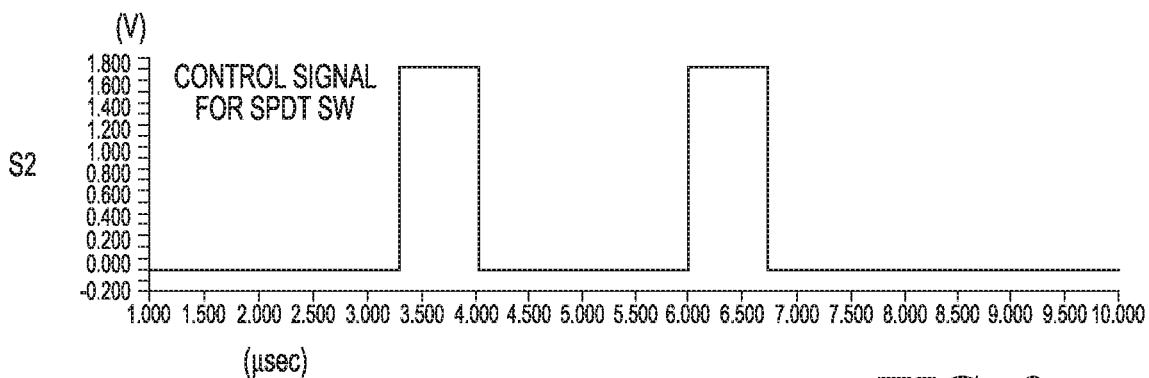
FIG. 3 illustrates an example of a time history diagram of a control signal for a single-pole double-throw switch of the integrated circuit of FIG. 1.
Figure 4:
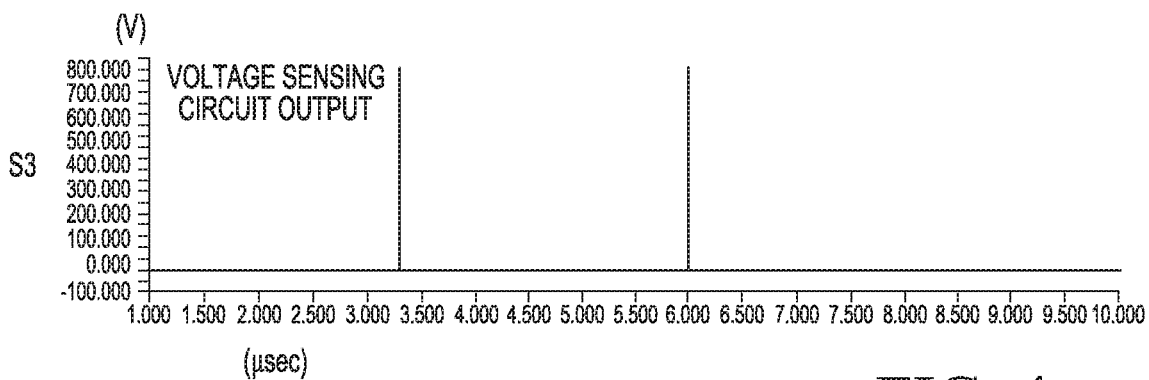
FIG. 4 illustrates an example of a time history diagram of an output signal of a voltage sensing circuit of the integrated circuit of FIG. 1.
Figure 5:
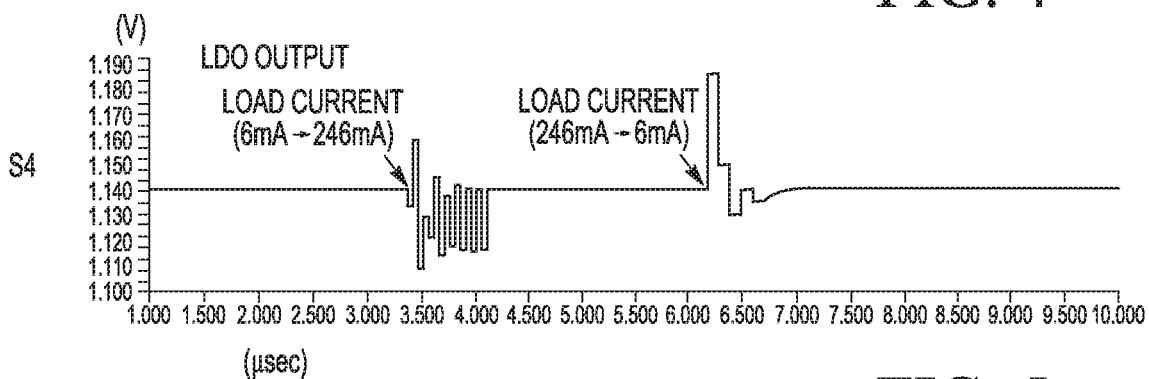
FIG. 5 illustrates an example of a time history diagram of an output signal of the low dropout regulator of the integrated circuit of FIG. 1.

Referring to FIGS. 1-5, FIGS. 2-5 show the status of signals S1-S4 of FIG. 1 during trim mode and monitor mode. FIG. 2 illustrates an example of a time history diagram of control signal S1 for the discharge transistor 112. FIG. 3 illustrates an example of a time history diagram of control signal S2 for SPDT switch 118. FIG. 4 illustrates an example of a time history diagram of output signal S3 of voltage sensing circuit 120. FIG. 5 illustrates an example of a time history diagram of LDO output current signal S4 of the low dropout regulator 108. When the LDO current signal S4 experiences a transient, for example, due to a change in the load shown between time T1 and T2, and between time T3 and T4, the output signal S3 of voltage sensing circuit 120 is asserted. With output signal S3 asserted, a reset or trim mode is triggered in which SAR control circuitry 104 adjusts resistor string 106 to cancel any offset or trim error in voltage regulator circuit 108. During the trim mode, signal S2 is set to control input to voltage sensing circuit 120 via operation of SPDT switch 118 so the reference voltage is provided to both branches of voltage sensing circuit until a new trim condition is reached. Aside from the reset pulse in signal S3, signal S3 remains unasserted throughout the trim and monitor modes until an overload condition is detected once again. Signal S1 shows the control signal coupled to control operation of discharge transistor 112 to discharge the LDO voltage to ground every clock cycle, to avoid the output of voltage monitor circuit 110 from being affected by the RC time constant of resistive element 114 and capacitor 116. After a predetermined number of clock cycles have completed during the trim mode, as determined by counter circuits 122, 126 in control circuitry 102, the trim mode is considered complete, and the output of AND gate 132 is set to select the monitor position for SPDT switch 118 to allow voltage sensing circuit 120 to monitor the LDO output voltage. The output of AND gate 134 is also set to prevent discharge transistor 112 from discharging the LDO output voltage during the monitor mode.

By now it should be appreciated that in some embodiments, an integrated circuit can comprise a voltage monitor circuit (110) having a first input coupled to a reference voltage (Ref) and a second input. A successive approximation register (SAR) circuit (104+106) has an input coupled to an output of the voltage monitor circuit. A low drop out (LDO) regulator (108) has an input ("−" of 152) coupled to an output of the SAR circuit and an output coupled to the second input and which provides an LDO output voltage. A discharge circuit (112) is coupled to the LDO output voltage. A voltage sensing circuit has a first input coupled to the reference voltage during a trim mode and coupled to the LDO output during a monitor mode, a second input coupled to the reference voltage, and an output which asserts a sense indicator that indicates when a voltage at the first input goes higher or lower than the reference voltage by a predetermined amount. Control circuit (102) is configured to control transition from the monitor mode to the trim mode in response to assertion of the sense indicator. During trim mode, the control circuit controls the discharge circuit to periodically discharge the LDO output voltage.

In another aspect, the SAR circuit can comprise SAR control logic (104) configured to be reset in response to assertion of the sense indicator and has an input coupled to the output of the voltage monitor circuit, and a variable resistance circuit coupled between outputs of the SAR control circuitry and the input of the LDO regulator circuit.

In another aspect, the SAR control circuitry can be configured to, during trim mode, sequentially set the outputs of the SAR control circuitry based on comparisons between the reference voltage and the LDO output voltage.

In another aspect, a resistance value of the variable resistance circuit at the first input of the LDO regulator circuit is determined by the outputs of the SAR control circuitry.

In another aspect, the control circuitry is configured to, during trim mode, enable the discharge circuit to discharge the LDO output prior to setting each output of the SAR control circuitry based on the comparison between the reference voltage and the LDO output voltage.

In another aspect, the trim mode ends after sequentially setting all the outputs of the SAR control circuitry.

In another aspect, the monitor mode follows the trim mode in which the first input of the voltage sensing circuit is coupled to the LDO output and not the reference voltage.

In another aspect, asserting the sense indicator comprises providing a pulse to the SAR circuit to reset the SAR circuitry and to the control circuitry to initiate a trim mode.

In another aspect, the control circuitry is configured to control the duration of the trim mode.

In another aspect, the voltage sensing circuit can comprise a first comparator (160) having an inverting input coupled to the first input of the voltage sensing circuit and a non-inverting input coupled to the reference voltage, and a second comparator (174) having an inverting input coupled to the reference voltage and a non-inverting input coupled to the second input of the voltage sensing circuit.

In another aspect, the voltage sensing circuit can further comprise first pulse generating circuitry (162-168) coupled to an output of the first comparator; and second pulse generating circuitry (176-181) coupled to an output of the second comparator. The first pulse generating circuitry is configured to provide the asserted sense indicator when the voltage at the first input of the voltage sensing circuit goes lower than the reference voltage. The second pulse generating circuitry is configured to provide the asserted sense indicator when the voltage at the first input of the voltage sensing circuit goes higher than the reference voltage.

In another aspect, the integrated circuit can further comprise a switch (118) having a first input coupled to the reference voltage, a second input coupled to the receive the LDO output, an output coupled to the first input of the voltage sensing circuit, and a control input coupled to the control circuitry. The switch is configured to couple the first input of the switch to the output of the switch during the trim mode and to couple the second input of the switch to the output of the switch during the monitor mode.

In other selected embodiments, an integrated circuit can comprise a low drop out (LDO) regulator circuit (108) having an output which provides an LDO output. A voltage sensing circuit (120) has a first input coupled to a reference voltage, a second input coupled to the output of the LDO regulator circuit, and an output which asserts a sense indicator that indicates when a voltage at the first input goes higher than the reference voltage by a first predetermined amount or lower than the reference voltage by a second predetermined amount.

In another aspect, detection and pulse generating the voltage sensing circuit comprises a first comparator (160) having an inverting input coupled to the first input of the voltage sensing circuit and a non-inverting input coupled to the second input of the voltage sensing circuit, and a second comparator (174) having an inverting input coupled to the reference voltage and a non-inverting input coupled to the second input of the voltage sensing circuit.

In another aspect, the voltage sensing circuit can further comprise first pulse generating circuitry (162-168) coupled to an output of the first comparator, and second pulse generating circuitry (176-181) coupled to an output of the second comparator. The first pulse generating circuitry has an output and is configured to provide the asserted sense indicator when the voltage at the first input of the voltage sensing circuit goes lower than the reference voltage by the second predetermined amount. The second pulse generating circuitry has an output and is configured to provide the asserted sense indicator when the voltage at the first input of the voltage sensing circuit goes higher than the reference voltage by the first predetermined amount.

In another aspect, the integrated circuit can further comprise an OR gate having a first input coupled to the output of the first pulse generating circuitry, a second input coupled to the output of the second pulse generating circuitry, and an output coupled to the output of the voltage sensing circuitry.

In another aspect, the first pulse generating circuitry can comprise first wave shaping circuitry configured to shape the output of the first comparator and the second pulse generating circuitry comprises second wave shaping circuitry configured to shape the output of the second comparator.

In further selected embodiments, in an integrated circuit configured to operate in a monitor mode and in a trim mode and having a low drop out (LDO) regulator and a successive approximation register (SAR) circuit having a variable resistance coupled to an input of the LDO regulator circuit, a method can comprise during the monitor mode: comparing an output of the LDO regulator circuit with a reference voltage, and asserting a sense indicator when a voltage at the output of the LDO regulator circuit goes higher or lower than the reference voltage by a predetermined amount. In response to asserting the sense indicator, a trim mode is entered and the SAR circuit is reset. During the trim mode, after resetting the SAR circuit, sequentially varying a resistance of the SAR circuit coupled to the input of the LDO regulator circuit based on a difference between a voltage at the output of the LDO and the reference voltage. In addition, prior to each varying of the resistance of the SAR circuit, discharging the LDO output voltage.

In another aspect, the method can further comprise, after varying the resistance of the SAR circuit a predetermined number of times, exiting the trim mode and entering the monitor mode.

In another aspect, asserting the sense indicator can comprise providing a pulse to reset the SAR circuit and initiate the trim mode.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, switches 20 and 22 may be implemented differently to allow for the trimming mode and normal operation mode configurations. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
    a voltage monitor circuit having a first input coupled to a reference voltage and a second input;
    a successive approximation register (SAR) circuit having an input coupled to an output of the voltage monitor circuit;
    a low drop out (LDO) regulator having an input coupled to an output of the SAR circuit and an output coupled to the second input and which provides an LDO output;
    a discharge circuit coupled to the LDO output;
    voltage sensing circuit having a first input coupled to the reference voltage during a trim mode and coupled to the LDO output during a monitor mode, having a second input coupled to the reference voltage, and an output which asserts a sense indicator that indicates when a voltage at the first input goes higher or lower than the reference voltage by a predetermined amount; and
    control circuitry configured to:
        control transition from the monitor mode to the trim mode in response to assertion of the sense indicator; and
        during trim mode, control the discharge circuit to periodically discharge the LDO output voltage.

2. The integrated circuit of claim 1, wherein the SAR circuit comprises:
    SAR control circuitry which is configured to be reset in response to assertion of the sense indicator and has an input coupled to the output of the voltage monitor circuit; and
    a variable resistance circuit coupled between outputs of the SAR control circuitry and the input of the LDO regulator circuit.

3. The integrated circuit of claim 2, wherein the SAR control circuitry is configured to, during trim mode, sequentially set the outputs of the SAR control circuitry based on comparisons between the reference voltage and the LDO output voltage.

4. The integrated circuit of claim 3, wherein a resistance value of the variable resistance circuit at the first input of the LDO regulator circuit is determined by the outputs of the SAR control circuitry.

5. The integrated circuit of claim 3, wherein the control circuitry is configured to, during trim mode, enable the discharge circuit to discharge the LDO output prior to setting each output of the SAR control circuitry based on the comparison between the reference voltage and the LDO output voltage.

6. The integrated circuit of claim 5, wherein the trim mode ends after sequentially setting all the outputs of the SAR control circuitry.

7. The integrated circuit of claim 6, wherein the monitor mode follows the trim mode in which the first input of the voltage sensing circuit is coupled to the LDO output and not the reference voltage.

8. The integrated circuit of claim 1, wherein asserting the sense indicator comprises providing a pulse to the SAR circuit to reset the SAR circuitry and to the control circuitry to initiate a trim mode.

9. The integrated circuit of claim 8, wherein the control circuitry is configured to control the duration of the trim mode.

10. The integrated circuit of claim 1, wherein the voltage sensing circuit comprises:
    a first comparator having an inverting input coupled to the first input of the voltage sensing circuit and a non-inverting input coupled to the reference voltage; and
    a second comparator having an inverting input coupled to the reference voltage and a non-inverting input coupled to the second input of the voltage sensing circuit.

11. The integrated circuit of claim 10, wherein the voltage sensing circuit further comprises:
    first pulse generating circuitry coupled to an output of the first comparator; and
    second pulse generating circuitry coupled to an output of the second comparator, wherein:

the first pulse generating circuitry is configured to provide the asserted sense indicator when the voltage at the first input of the voltage sensing circuit goes lower than the reference voltage, and the second pulse generating circuitry is configured to provide the asserted sense indicator when the voltage at the first input of the voltage sensing circuit goes higher than the reference voltage.

12. The integrated circuit of claim 11, further comprising:
a switch having a first input coupled to the reference voltage, a second input coupled to the receive the LDO output, an output coupled to the first input of the voltage sensing circuit, and a control input coupled to the control circuitry, wherein the switch is configured to couple the first input of the switch to the output of the switch during the trim mode and to couple the second input of the switch to the output of the switch during the monitor mode.

13. An integrated circuit comprising:
a low drop out (LDO) regulator having an output which provides an LDO output; and
voltage sensing circuit having a first input coupled to a reference voltage during a trim mode and coupled to the LDO output during a monitor mode, a second input coupled to the reference voltage, and an output which asserts a sense indicator that indicates when a voltage at the second input goes higher than the reference voltage by a first predetermined amount and alternatively when the voltage at the second input goes lower than the reference voltage by a second predetermined amount.

14. The integrated circuit of claim 13, wherein the voltage sensing circuit comprises:
a first comparator having an inverting input coupled to the first input of the voltage sensing circuit and a non-inverting input coupled to the second input of the voltage sensing circuit; and
a second comparator having an inverting input coupled to the reference voltage and a non-inverting input coupled to the second input of the voltage sensing circuit.

15. The integrated circuit of claim 14, wherein the voltage sensing circuit further comprises:
first pulse generating circuitry coupled to an output of the first comparator;
second pulse generating circuitry coupled to an output of the second comparator, wherein:
the first pulse generating circuitry has an output and is configured to provide the asserted sense indicator when the voltage at the first input of the voltage sensing circuit goes lower than the reference voltage by the second predetermined amount, and
the second pulse generating circuitry has an output and is configured to provide the asserted sense indicator when the voltage at the first input of the voltage sensing circuit goes higher than the reference voltage by the first predetermined amount.

16. The integrated circuit of claim 15, further comprising:
an OR gate having a first input coupled to the output of the first pulse generating circuitry, a second input coupled to the output of the second pulse generating circuitry, and an output coupled to the output of the voltage sensing circuitry.

17. The integrated circuit of claim 15, wherein the first pulse generating circuitry comprises first wave shaping circuitry configured to shape the output of the first comparator and the second pulse generating circuitry comprises second wave shaping circuitry configured to shape the output of the second comparator.

18. In an integrated circuit configured to operate in a monitor mode and in a trim mode and having a low drop out (LDO) regulator and a successive approximation register (SAR) circuit having a variable resistance coupled to an input of the LDO regulator circuit, a method comprising:
during the monitor mode:
comparing an output of the LDO regulator circuit with a reference voltage;
asserting a sense indicator when a voltage at the output of the LDO regulator circuit goes higher or lower than the reference voltage by a predetermined amount;
in response to asserting the sense indicator, entering a trim mode and resetting the SAR circuit;
during the trim mode:
after the resetting the SAR circuit, sequentially varying a resistance of the SAR circuit coupled to the input of the LDO regulator circuit based on a difference between a voltage at the output of the LDO and the reference voltage, wherein the method further includes, prior to each varying of the resistance of the SAR circuit, discharging the LDO output voltage.

19. The method of claim 18, further comprising:
after varying the resistance of the SAR circuit a predetermined number of times, exiting the trim mode and entering the monitor mode.

20. The method of claim 18, wherein asserting the sense indicator comprises providing a pulse to reset the SAR circuit and initiate the trim mode.

* * * * *